(12) United States Patent
Hayashi

(10) Patent No.: US 6,603,186 B2
(45) Date of Patent: Aug. 5, 2003

(54) BIPOLAR TRANSISTOR WITH BASE DRIVE CIRCUIT PROTECTION

(75) Inventor: Tetsuya Hayashi, Yokosuka (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 10/052,438

(22) Filed: Jan. 23, 2002

(65) Prior Publication Data

US 2002/0100927 A1 Aug. 1, 2002

(30) Foreign Application Priority Data

Feb. 1, 2001 (JP) ........................................ 2001-025080

(51) Int. Cl.⁷ ........................... H01L 23/58; H01L 29/00
(52) U.S. Cl. ...................... 257/494; 257/490; 257/491; 257/495; 257/552; 257/557
(58) Field of Search .................. 257/490, 491, 257/494, 495, 552, 577

(56) References Cited

U.S. PATENT DOCUMENTS 6,013,941 A * 1/2000 Shimizu ..................... 257/565
6,198,126 B1 * 3/2001 Mori et al. ................. 257/328

* cited by examiner

*Primary Examiner*—Ngân V. Ngô
(74) *Attorney, Agent, or Firm*—McDermott, Will & Emery

(57) ABSTRACT

An n+ type emitter region and a p-type base region are formed in contact with one main surface of an n-type collector region, a p-type cathode region is formed in a ring shape in contact with the main surface so as to enclose the emitter region and the base region, the potential at the cathode region is sustained at a level equal to the potential at the emitter region and a p-type guard ring region is formed in a ring shape so as to enclose the cathode region. This structure prevents the base drive circuit from becoming damaged by an avalanche breakdown current.

8 Claims, 5 Drawing Sheets

2 ⋯ COLLECTOR REGION
3 ⋯ EMITTER REGION
8 ⋯ BASE REGION
9 ⋯ CATHODE REGION

22 ··· COLLECTOR REGION
23 ··· EMITTER REGION
24 ··· FIRST MOS ELECTRODE
25 ··· FIRST INSULATING FILM
26 ··· FIRST FIXED POTENTIAL INSULATED ELECTRODE
27 ··· CHANNEL REGION

BIPOLAR TRANSISTOR WITH BASE DRIVE CIRCUIT PROTECTION

BACKGROUND OF THE INVENTION

1. Field of the Invention

The present invention relates to a current-controlled semiconductor device (power device) such as a bipolar transistor or a bipolar static induction transistor.

2. Description of the Related Art

FIG. 5 shows a cross sectional structure of a bipolar transistor with a guard ring structure achieved in the related art. As shown in FIG. 5, an n-type collector region 52 is formed on an n+ substrate region 51, with a p-type base region 58 formed in the upper collector region 52. In addition, an n+ type emitter region 53 is formed in the upper base region 58.

At the upper surface of the collector region 52, an insulating film layer 60 is formed. A collector electrode 61 achieves ohmic contact with the substrate region 51, whereas an emitter electrode 63 achieves ohmic contact with the emitter region 53 via an emitter contact hole provided at the insulating film layer 60. Base electrodes 68 achieve ohmic contact with the base region 58 via base contact holes provided at the insulating film layer 60.

A p-type guard ring region 70 is formed in a ring shape so as to enclose the base region 58 and the emitter region 53 and is not connected to any of the electrodes. It is to be noted that while FIG. 5 shows a single guard ring region 70, the quantity of guard ring regions 70 that should be provided is determined in correspondence to the required withstanding voltage and the like.

It is to be noted that while FIG. 5 shows a single unit bipolar transistor, a plurality of bipolar transistor unit structures are formed in conformance to the required current capacity.

The operation of the bipolar transistor (device) achieved in the related art shown in FIG. 5 is now explained. This bipolar transistor is utilized by applying, for instance, a ground potential (0 V) to the emitter electrode 63 and applying a positive potential to the collector electrode 61. In addition, the base electrode 68 and the emitter electrode 63 are connected with a base drive circuit provided as an external circuit so as to allow the bipolar transistor to be driven as a switching device. ON/OFF control on the bipolar transistor is achieved in response to a signal provided by the base drive circuit.

When the ground potential or a negative potential is applied to the base electrode 68 to set the bipolar transistor in an OFF state, a reverse bias is applied between the p-type base region 58 and the n-type collector region 52, resulting in an extension of a depletion layer. If the potential applied to the collector electrode 61 is raised at this time, an avalanche breakdown occurs between the base region 58 and the collector region 52.

SUMMARY OF THE INVENTION

If an avalanche breakdown occurs between the base region 58 and the collector region 52 in a current-controlled semiconductor device such as the bipolar transistor in the related art, the avalanche breakdown current is allowed to flow to the base drive circuit. Accordingly, it is necessary to take measures such as the use of a device with a large current capacity to constitute the base drive circuit, in order to ensure that the base drive circuit is not damaged by the avalanche breakdown current.

An object of the present invention is to provide a semiconductor device achieving a structure that prevents the base drive circuit from being damaged by the avalanche breakdown current.

A semiconductor device according to the present invention, which is a current-driven semiconductor device having a semiconductor substrate of one conduction type constituting a collector region, an emitter region of a conduction type which is the same as the conduction type at the collector region and a base region of a conduction type opposite from the conduction type at the collector region both formed in contact with one main surface of the collector region, and includes a cathode region of a conduction type opposite from that at the collector region, which is in contact with the main surface but is not in contact with either the emitter region or the base region, with the cathode region achieving a potential equal to the potential at the emitter region and formed in a ring shape so as to enclose the emitter region and the base region.

A semiconductor device according to the present invention, which is a current-driven semiconductor device having a semiconductor substrate of one conduction type constituting a collector region, an emitter region of a conduction type which is the same as the conduction type at the collector region and a base region of a conduction type opposite from the conduction type at the collector region both formed in contact with one main surface of the collector region includes first trenches provided so as to lie in contact with the main surface and to sandwich the emitter region, first fixed-potential insulated electrodes provided inside the first trenches, insulated from the collector region by a first insulating film and achieving a potential sustained at a level equal to the potential at the emitter region, a channel region that constitutes a portion of the collector region that is in contact with the emitter region and is sandwiched by the first fixed-potential insulated electrodes and a cathode region of the conduction type opposite from that at the collector region, which is in contact with the main surface but is not in contact with either the emitter region or the base region. In this semiconductor device, the base region is in contact with the main surface, the first insulating film and the collector region but is not in contact with the emitter region, the first fixed-potential insulated electrodes are constituted of a conductive material achieving a work function which allows a depletion layer to be formed at the adjacent collector region via the first insulating film, the distance between the bottoms of the first trenches to the emitter region at the channel region, i.e., the channel length, is at least twice the distance between the sidewalls of the first trenches facing opposite each other at the channel region, i.e., the channel thickness, the potential at the cathode region is sustained at a level equal to the potential at the emitter region and the cathode region is formed in a ring shape so as to enclose the emitter region, the first fixed-potential insulated electrodes and the base region.

DETAILED DESCRIPTION OF THE PREFERRED EMBODIMENTS (First Embodiment)

Figure 1:
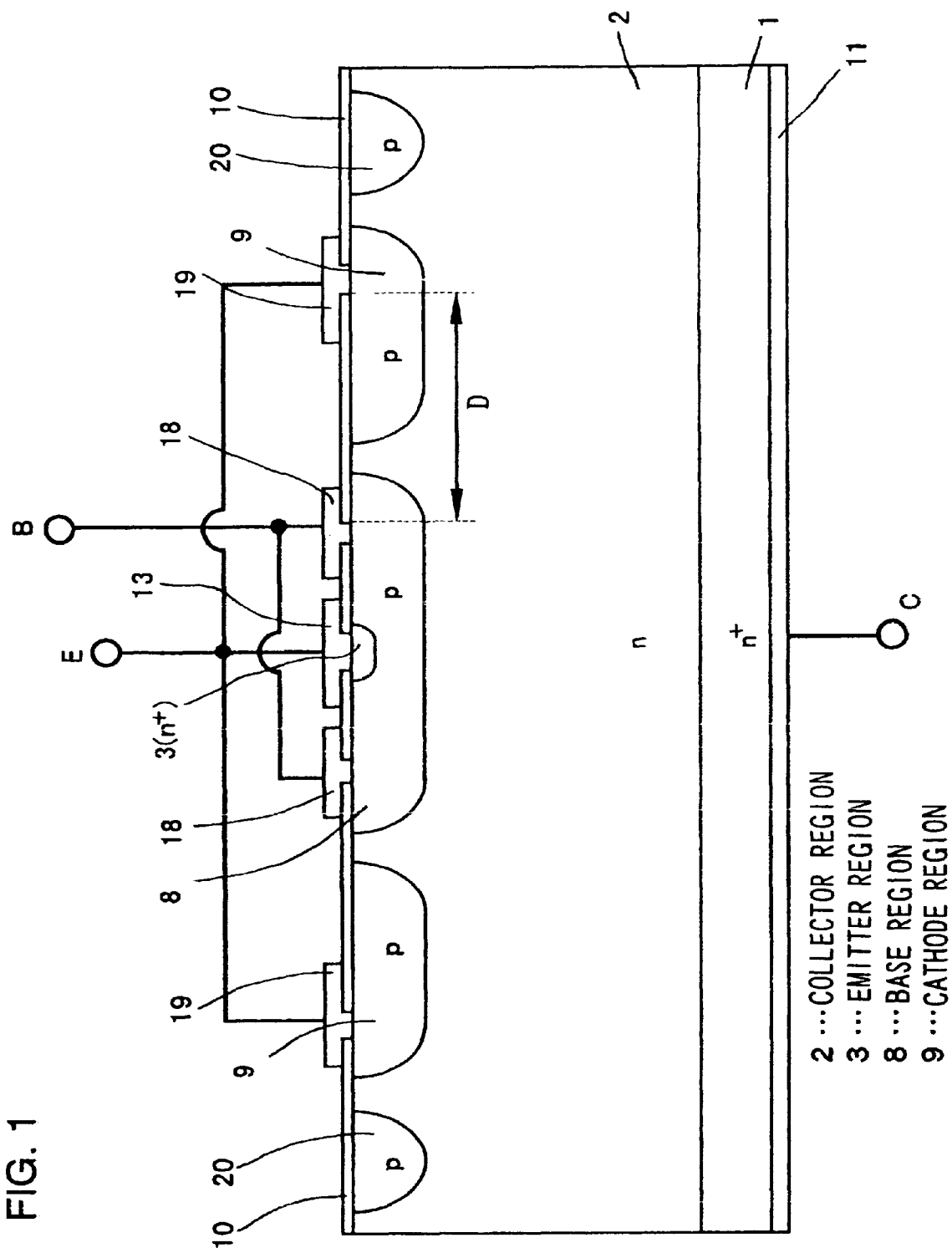
FIG. 1 is a sectional view of a first embodiment of the semiconductor device according to the present invention.

FIG. 1 illustrates the first embodiment of the semiconductor device according to the present invention in a sectional view provided to facilitate an explanation of the basic structure assumed in the bipolar transistor (device) It is to be noted that an explanation is given on the semiconductor device achieved in the first embodiment by assuming that silicon constitutes the semiconductor.

As shown in FIG. 1, an n-type collector region 2 is formed on an n+ type substrate region 1, a p-type base region 8 is formed in the upper collector region 2 and an n+ type emitter region 3 is formed in the upper base region 8 in the semiconductor device in the first embodiment. Namely, at a main surface of the semiconductor substrate of a given conduction type (n-type) constituting the collector region 2, the emitter region 3 achieving a conduction type (n-type) matching the conduction type at the collector region 2 and the base region 8 of a conduction type (p-type) opposite from the conduction type at the collector region 2 are formed. In addition, an insulating film layer 10 is formed at the upper surfaces of the collector region 2, the emitter region 3 and the base region 8.

A collector electrode 11 achieves ohmic contact with the substrate region 1. An emitter electrode 13 achieves ohmic contact with the emitter region 3 via an emitter contact hole provided at the insulating film layer 10. Base electrodes 18 achieve ohmic contact with the base region 8 via base contact holes provided at the insulating film layer 10.

A p-type cathode region 9 is formed in a ring shape so as to enclose the emitter region 3 and the base region 8. It is to be noted that while only a single bipolar transistor unit is shown inside the ring shaped cathode region 9 in FIG. 1, a plurality of bipolar transistor unit structures may be formed in conformance to the required current capacity.

A cathode electrode 19 achieves ohmic contact with the cathode region 9 via a cathode contact hole provided at the insulating film layer 10. The potential at the cathode electrode 19 (the cathode region 9) is sustained at a level equal to the potential at the emitter electrode 13 (the emitter region 3). In other words, the cathode region 9 is formed so as to be in contact with the main surface but is not in contact with either the emitter region 3 or the base region 8. The cathode region 9 achieves a conduction type (p-type) opposite from the conduction type at the collector region 2.

The distance D between a base contact hole through which the base region 8 and the base electrode 18 achieve contact and a cathode contact hole through which the cathode region 9 and the cathode electrode 19 achieve contact is set larger than the diffusion length of the minority carrier entering the collector region 2 from the base region 8 for the following reason.

A p-type guard ring region 20, which is formed in a ring shape so as to enclose the cathode region 9, is not connected to any of the electrodes. It is to be noted that while FIG. 1 shows a single guard ring region 20, the required quantity of guard ring regions 20 is determined in conformance to the voltage withstanding performance and the like that are to be achieved and thus, a plurality of guard ring regions may be provided.

It is to be noted that a distance between the cathode region 9 and the base region 8 is equal to or less than a distance between the cathode region 9 and the guard ring region 20.

The operation of the bipolar transistor achieved in the first embodiment shown in FIG. 1 is now explained. This bipolar transistor is utilized by applying, for instance, a ground potential (0V) to the emitter electrode 13 and applying a positive potential to the collector electrode 11 via a load. More specifically, the bipolar transistor may be utilized as the lower arm of an H bridge circuit that drives an electric car motor. In addition, the base electrode 18 and the emitter electrode 13 are connected with a base drive circuit provided as an external circuit so as to allow the bipolar transistor to be used as a switching device. ON/OFF control of the bipolar transistor is achieved in response to a signal provided by the base drive circuit.

While the ground potential or a negative potential is applied to the base electrode 18, the bipolar transistor is in an OFF state. The ring shaped cathode region 9 (p-type) is provided to enclose the base region 8 (p-type) over a predetermined distance in the semiconductor device in the first embodiment. Since a depletion layer extends from both sides at the collector region 2 between the base region 8 and the cathode region 9, the electric field distribution in the collector region 2 located between the base region 8 and the cathode region 9 is uniform. Accordingly, the electric field in the collector region does not concentrate at the edges of the base region 8.

In other words, in the semiconductor device in the first embodiment, the electric field concentrates to a part of the end of the cathode region 9 on the side facing opposite the guard ring region 20. As a result, if the electric field at this end reaches the critical range when the bipolar transistor in an ON state is turned off, an avalanche breakdown occurs between the cathode region 9 and the collector region 2.

Since the cathode region 9 is connected to the emitter electrode 13 achieving a potential equal to the potential at the cathode electrode 19, the avalanche breakdown current flows between the collector electrode 11 and the emitter electrode 13. In other words, the avalanche breakdown current is not allowed to flow to the base drive circuit which is connected as an external circuit between the base electrode 18 and the emitter electrode 13, and thus, a structure that prevents the base drive circuit from being damaged by the avalanche breakdown current is achieved.

Next, the operation performed in an ON state is examined. When a positive potential of, for instance, +0.7 V is applied to the base electrode 18, i.e., to the p-type base region 8, the pn junction constituted of the p-type base region 8 and the n-type collector region 2 takes on a forward bias and, as a result, holes are injected into the collector region 2. This raises the conductivity at the n-type collector region 2 which is designed to have a low impurity concentration and a high resistance in order to sustain a specific degree of device voltage withstanding performance, resulting in a current flow with a low resistance.

As described earlier, since the distance D between the base contact hole and the cathode contact hole is set larger than at least the diffusion length of the holes (minority carrier), the holes injected into the collector region 2 do not flow into the cathode region 9. Thus, the holes having been injected into the collector region 2 all eventually flow into the emitter region 3. Consequently, the current gain which represents the drive efficiency of the base current relative to the collector current is sustained at a specific level.

When the ground potential is applied to the base electrode 18 in order to turn off the bipolar transistor, any excess holes in the collector region 2 flow into the p-type base region 8. This results in a gradual decrease in the hole concentration in the collector region 2 starting at the region near the base region 8, and eventually the holes in the collector region 2 are extracted to ultimately turn off the bipolar transistor. At this time, the base drive circuit remains well protected since the avalanche breakdown attributable to a higher collector potential occurs between the collector region 2 and the cathode region 9 as explained earlier.

When a negative potential equal to or less than −0.7 V is applied to the collector electrode 11 in the semiconductor device achieved in the first embodiment while the ground potential or a negative potential is applied to the base electrode 18, the diode formed between the cathode region 9 (p-type) connected to the emitter electrode 13 and the collector region 2 (n-type) takes on a forward bias, resulting in a current flow. In other words, the semiconductor device in the first embodiment achieves a structure internally provided with a reverse diode between the collector electrode 11 (the collector region 2) and the emitter electrode 13 (the emitter region 3) and thus, the cathode region 9 can be utilized as a free-wheel diode. This means that it is not necessary to externally mount a free-wheel diode as a protective device.

(Second Embodiment)

Figure 2:
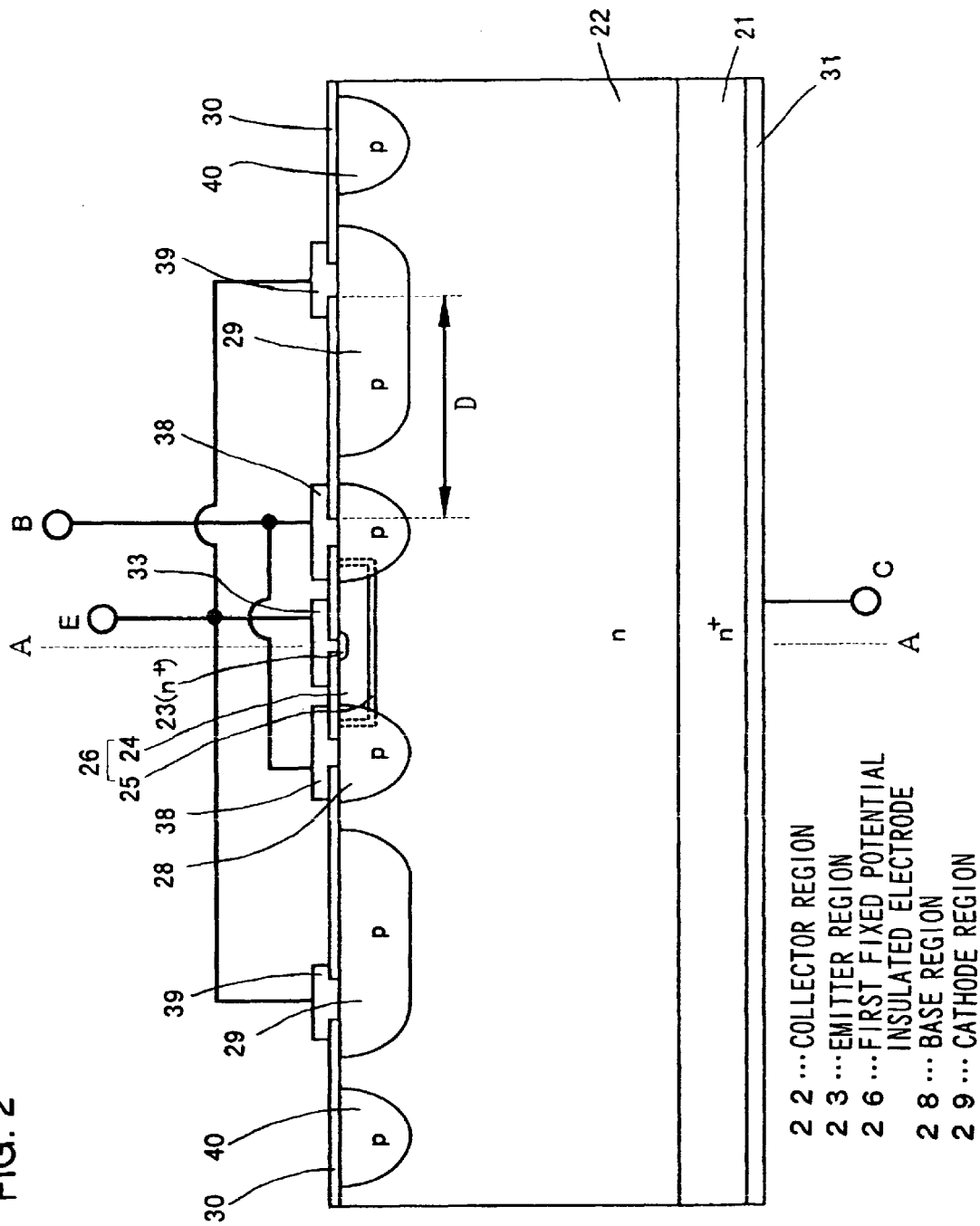
FIG. 2 is a sectional view of a second embodiment of the semiconductor device according to the present invention.
Figure 3:
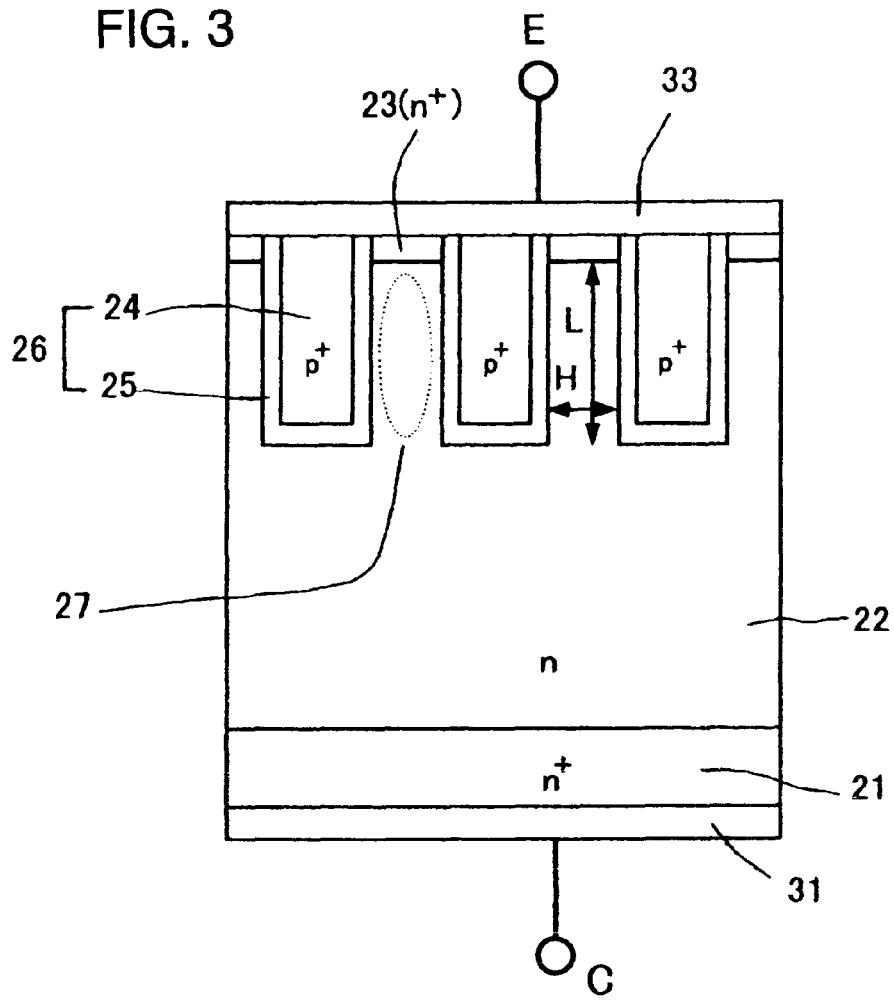
FIG. 3 is a sectional view of the semiconductor device shown in FIG. 2 taken along A—A.

FIGS. 2 and 3 illustrate the semiconductor device according to the present invention achieved in the second embodiment. FIG. 2 presents a sectional view illustrating the basic structure of the device and FIG. 3 is a sectional view of the device shown in FIG. 2 taken along A—A. It is to be noted that as in the explanation of the semiconductor device in the first embodiment, the semiconductor device in the second embodiment is explained by assuming that the semiconductor is constituted of silicon.

As shown in FIGS. 2 and 3, an n-type collector region 22 is formed on an n+ type substrate region 21 and an n+ type emitter region 23 is formed in the upper collector region 22. In addition, a plurality of first trenches having almost vertical sidewalls to form, for instance, a U-shape, enclose the emitter region 23. A first insulating film 25 is formed inside each of the first trenches and a first MOS electrode 24 is formed inside the first insulating film 25 at each first trench. The first MOS electrodes 24 are constituted of a highly concentrated p+ type polysilicon.

An insulating film layer 30 is formed at the upper surfaces of the collector region 22, the emitter region 23 and the first MOS electrodes 24. A collector electrode 31 achieves ohmic contact with the substrate region 21. An emitter electrode 33 achieves ohmic contact with the emitter region 23 and the first MOS electrodes 24 via emitter contact holes provided at the insulating film layer 30. The potential at the first MOS electrode 24 is fixed at the emitter potential. A first fixed-potential insulated electrodes 26 as referred to in the following description is constituted of a first MOS electrode 24 and the first insulating film 25.

It is to be noted that while the emitter region 23 is illustrated in the figures as though it is in contact with the first insulating film 25, the emitter region 23 does not need to be in contact with the insulating film 25 as long as the emitter region 23 is set so that it is sandwiched by the plurality of first fixed-potential insulated electrodes 26. Namely, the semiconductor device should assume the following structural features. The emitter region 23 of a conduction type (n-type) which is the same as the conduction type at the collector region 22 is formed in contact with one main surface of the semiconductor substrate achieving a given conduction type (n-type) constituting the collector region 22. The semiconductor device includes the plurality of first trenches provided so as to sandwich the emitter region 23 and set in contact with the main surface. Inside each first trench, a first fixed-potential insulated electrodes 26 which is insulated from the collector region 22 by the first insulating film 25 and has a potential sustained at a level equal to the potential at the emitter region 23 is provided. The first fixed-potential insulated electrodes 26 are constituted of a conductive material achieving a work function which allows a depletion layer to be formed at the collector region 22, positioned in contact with the first fixed-potential insulated electrodes 26 via the first insulating film 25.

In FIG. 3, a portion of the collector region 22 which is sandwiched by a pair of first fixed-potential insulated electrodes 26 is referred to as a channel region 27. Namely, the channel region 27 is constituted of a portion of the collector region 22 that is in contact with the emitter region 23 and is sandwiched by a pair of first fixed-potential insulated electrodes 26. At the channel region 27, a potential barrier that prevents any movement of the majority carrier by the depletion layer around the first fixed potential insulated electrodes 26 is formed. The channel length (the distance between the emitter region 23 and the bottom of the first fixed-potential insulated electrodes 26) L of the channel region 27 is set twice or three times as large as the channel thickness (the distance between the two first fixed potential electrodes 26 facing opposite each other inside the channel region 27) H.

In addition, as shown in FIG. 2, a p-type base region 28 which is in contact with the first insulating film 25 is provided over a distance from the emitter region 23. In other words, the p-type base region 28 is in contact with the main surface, the first insulating film 25 and the collector region 22 but is not in contact with the emitter region 23. The conduction type achieved at the base region 28 is opposite (p-type) from the conduction type at the collector region 22. A base electrode 38 achieves ohmic contact with the base region 28 via a base contact hole provided at the insulating film layer 30.

A p-type cathode region 29 is formed in a ring shape so as to enclose the emitter region 23, the base region 28 and the first fixed-potential insulated electrode 26. It is to be noted that while FIG. 2 only shows a single structural unit constituted of the emitter region 23, the base region 28 and the first fixed-potential insulated electrodes 26 inside the ring shaped cathode region 29, a plurality of structural units should be formed in correspondence to the required current capacity.

A cathode electrode 39 achieves ohmic contact with the p-type cathode region 29 via a cathode contact hole provided at the insulating film layer 30. The potential at the cathode electrode 39 (the p-type cathode region 29) is sustained at a level equal to the potential at the emitter electrode 33 (the emitter region 23). The conduction type achieved at the cathode region 29 is opposite (p-type) from the conduction type at the collector region 22. In addition, the cathode region 29 is in contact with the main surface but is not in contact with either the emitter region 23 or the base region 28.

The distance D between the base contact hole through which the base region 28 and the base electrode 18 achieve contact and a cathode contact hole through which the cathode region 29 and the cathode electrode 39 achieve contact is set larger than the diffusion length of the minority carrier entering the collector region 2 from the base region 28. A guard ring region 40, which is formed in a ring shape so as to enclose the cathode region 29, is not connected to any of the electrodes. It is to be noted that while FIG. 2 shows a single guard ring region 40, the required quantity of guard ring regions 40 is determined in conformance to the voltage withstanding performance and the like that are to be achieved and thus, a plurality of guard ring regions may be provided.

The operation of the semiconductor device achieved in the embodiment shown in FIGS. 2 and 3 is now explained. This device is utilized by applying, for instance, the ground potential (0V) to the emitter electrode 33 and applying a positive potential to the collector electrode 31 via, for instance, an inductive load. In addition, the base electrode 38 and the emitter electrode 33 are connected with a base drive circuit provided as an external circuit so as to allow the device to be used as a switching device. ON/OFF control of the semiconductor device is achieved in response to a signal provided by the base drive circuit.

While the ground potential or a negative potential is applied to the base electrode 38, the device is in an OFF state. As shown in FIG. 3, depletion layers resulting from the built-in voltage at the first MOS electrodes 24 are formed around the first fixed-potential insulated electrodes 26. If the channel thickness H is small enough, a sufficient potential barrier against conduction electrons is formed by the depletion layers at the channel regions 27.

For instance, by setting the thickness of the first insulating film 25 equal to or less than 100 nm, the impurity concentration at the channel region 27 equal to or less than $1 \times 10^{14}$ $cm^{-3}$ and the channel thickness H equal to or less than 2 $\mu$m, a potential barrier that is sufficient for preventing the conduction electrons within the emitter region 23 from moving toward the collector region 22 through the channel region 27 can be formed. As the channel thickness H becomes smaller, the barrier performance with which the movement of the conduction electrons is cut off improves. Since the channel length L is set at least twice or three times as large as the channel thickness H, the effect of the potential barrier is not lessened by the electric field from the collector region 22.

Since the ring shaped cathode region 29 is provided to enclose the base region 28 over a predetermined distance in the semiconductor device in the second embodiment, the electric field in the collector region does not concentrate at the edges of the base region 28 as in the semiconductor device in the first embodiment. Since a depletion layer extends from both sides at the collector region 22 between the base region 28 and the cathode region 29, the electric field distribution in the collector region 22 located between the base region 28 and the cathode region 29 is uniform.

In other words, in the semiconductor device in the second embodiment, too, the electric field concentrates to a part of the end of the cathode region 29 on the side facing opposite the guard ring region 40. As a result, if the electric field at this end reaches the critical range when the bipolar transistor in an ON state is turned off, an avalanche breakdown occurs between the cathode region 29 and the collector region 22. Since the cathode region 29 is connected to the emitter electrode 33 having a potential equal to the potential at the cathode electrode 39, the avalanche breakdown current flows between the collector electrode 31 and the emitter electrode 33. In other words, the avalanche breakdown current is not allowed to flow to the base drive circuit which is connected as an external circuit between the base electrode 38 and the emitter electrode 33, and thus, a structure that prevents the base drive circuit from being damaged by the avalanche breakdown current is achieved.

Next, the operation performed in an ON state is examined. When a positive potential of, for instance, +0.5 V is applied to the base electrode 38, i.e., the base region 28, holes flow from the p-type base region 28 to the interface of the first insulating film 25 to form an inversion layer. As a result, the line of electric force extending from the first MOS electrode 24 forming the potential barrier to the channel region 27 becomes shielded, lowering the effect of the potential barrier against the conduction electrons in the channel region 27. In other words, the collector region 22 and the emitter region 23 become electrically continuous.

As the potential at the base electrode 38 is further raised, the pn junction constituted of the p-type base region 28 and the surrounding n-type collector region 22 takes on a forward bias, allowing the holes to be directly injected into the collector region 22 and the channel region 27. This raises the conductivity at the n-type collector region 22 which is designed to have a low impurity concentration and a high resistance in order to sustain a specific degree of device voltage withstanding performance, resulting in a current flow with a low resistance.

As described earlier, since the distance D between the base contact hole and the cathode contact hole is set at least larger than the diffusion length of the holes, the holes injected into the collector region 22 do not flow into the cathode region 29 in the semiconductor device in the second embodiment. Thus, the holes having been injected into the collector region 22 all eventually flow into the emitter region 23. Consequently, the current gain which represents the drive efficiency of the base current relative to the collector current is sustained at a specific level.

When the ground potential is applied to the base electrode 38 in order to turn off the device, any excess holes in the collector region 22 flow into the p-type base region 28. This results in a gradual decrease in the hole concentration in the collector region 22 starting at the region near the base region 28. At the channel region 27, the hole supply from the base region 28 stops eventually. As the hole density becomes lower at the channel region 27, the high-level injection state becomes cleared, and the holes form an inversion layer at the interface of the first insulating film 25. At this time, the holes travel through the inversion layer, which extends continuously from the channel region 27 to the base region 28 to flow into the p-type base region 28, and are ultimately released into the base electrode 38.

Subsequently, the holes in the collector region 22 and the channel region 27 are extracted, and the potential barrier against electrons is restored at the channel region 27. This causes a sudden increase in the collector potential at the bipolar transistor so as to sustain the collector current flowing via the inductive load, and a potential exceeding the predetermined voltage applied via the inductive load is applied to the collector electrode 31. When the collector potential rises to a level at which an avalanche breakdown occurs, an avalanche breakdown current flows between the cathode region 29 and the collector region 22. In other words, the current which has been flowing as the collector current thus far now flows from the collector electrode 31 to the emitter electrode 33 via the cathode region 29. Thus, the avalanche breakdown current does not flow into the base drive circuit when the device engages in dynamic behavior, either.

When a negative potential equal to or less than −0.7 V is applied to the collector electrode 31 in the semiconductor device achieved in the second embodiment while the ground potential or a negative potential is applied to the base electrode 38, the diode formed between the cathode region 29 and the collector region 22 connected to the emitter electrode 33 takes on a forward bias, resulting in a current flow. In other words, the semiconductor device in the second embodiment achieves a structure internally provided with a reverse diode between the collector electrode 31 and the emitter electrode 33 and thus, the cathode region 29 can be utilized as a free-wheel diode. This means that it is not necessary to externally mount a free-wheel diode as a protective device against the counter electromotive force that manifests when the drive of the inductive load stops.
(Third Embodiment)

Figure 4:
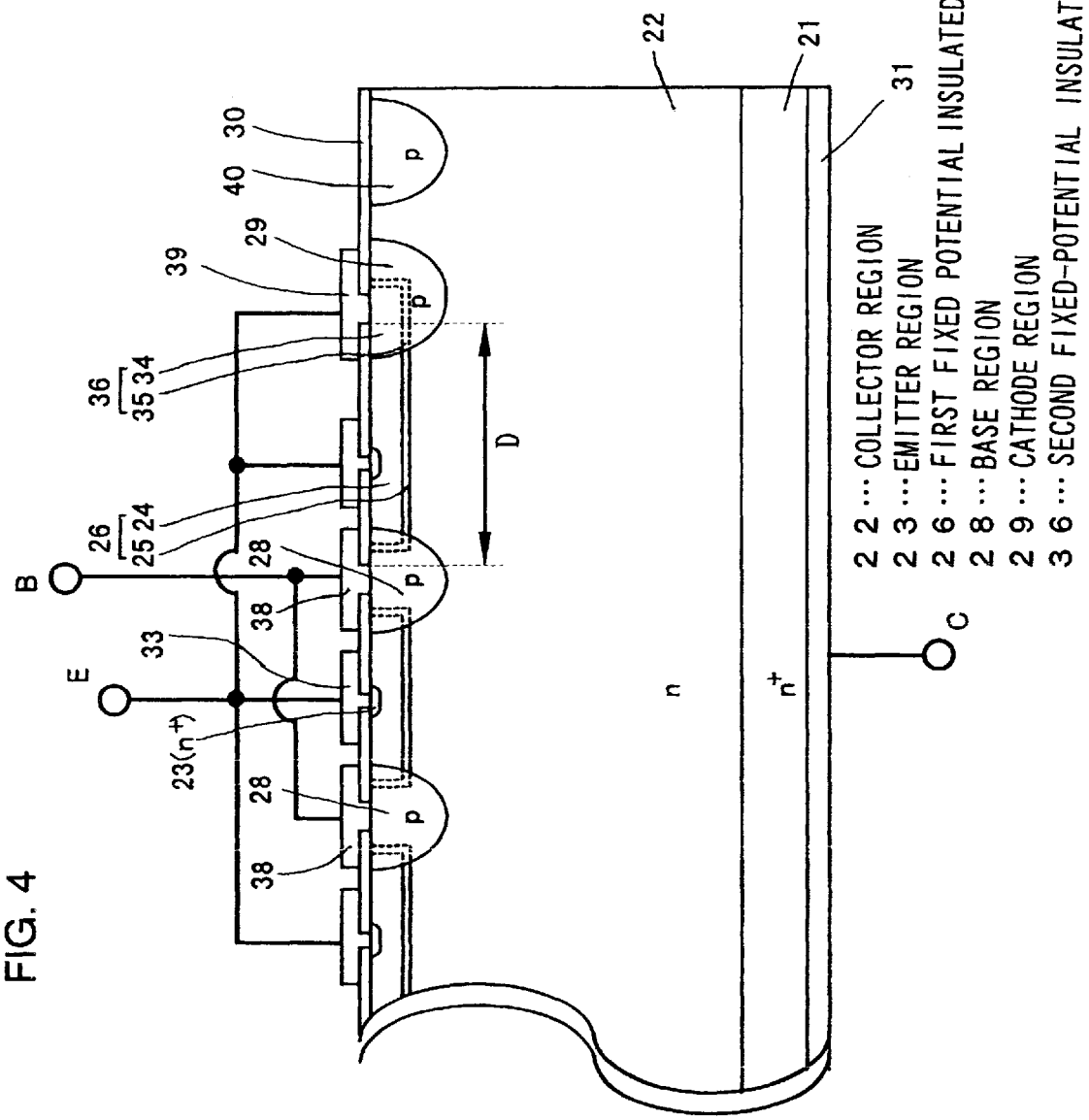
FIG. 4 is a sectional view of a third embodiment of the semiconductor device according to the present invention.
Figure 5:
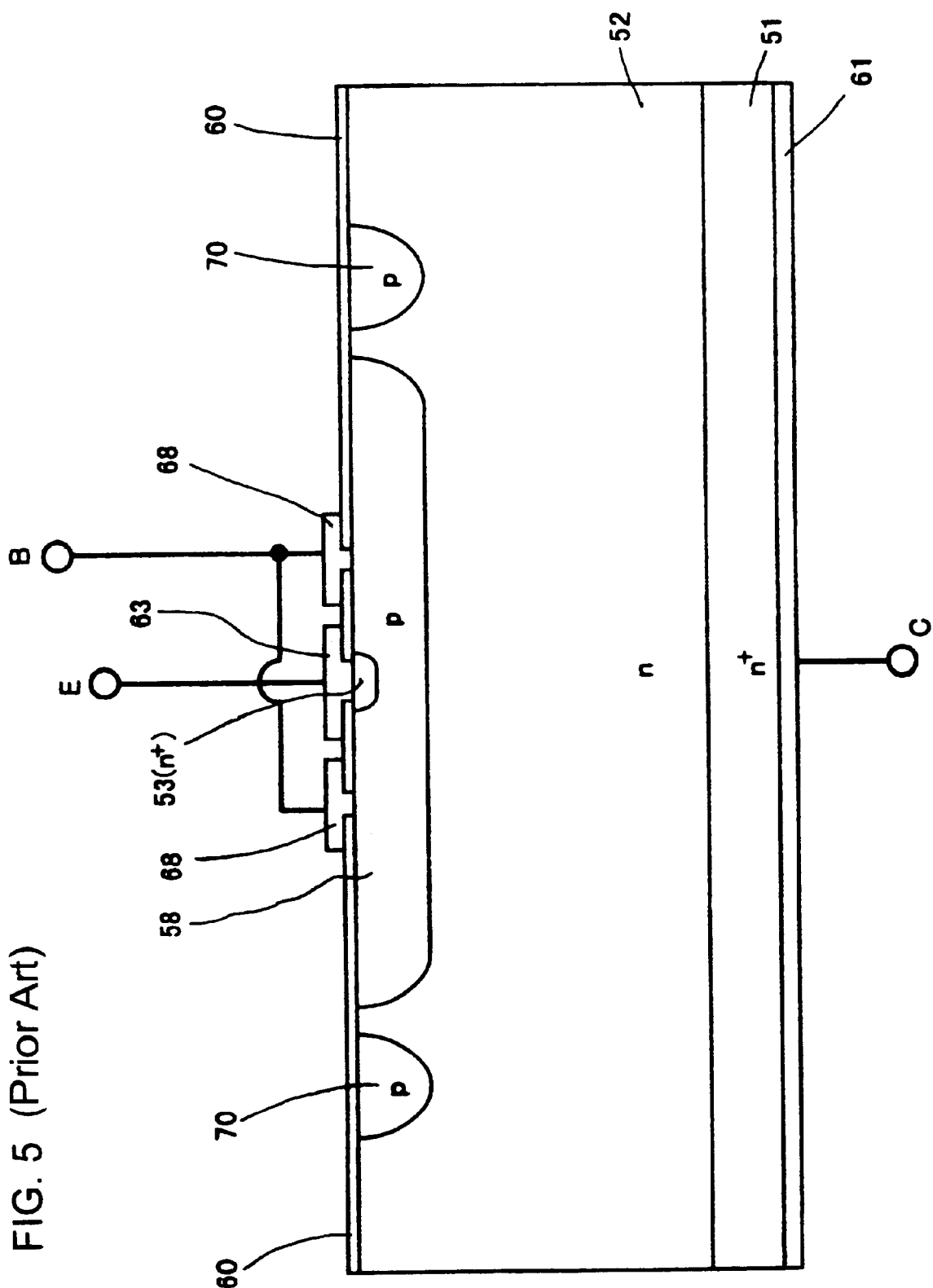
FIG. 5 is a sectional view of a bipolar transistor achieved in the related art.

FIG. 4 shows the semiconductor device according to the present invention achieved in the third embodiment. FIG. 4 presents a sectional view containing one side of a ring shaped cathode region 29. In addition, a plurality of structural units constituted of a base region 28, an emitter region 23 and first fixed-potential insulated electrodes 26 are formed inside the ring shaped cathode region 29. To the left of the structure shown in FIG. 4, the base region 28, the emitter region 23 and the first fixed-potential insulated electrodes 26 are provided in repeated arrays.

The semiconductor device shown in FIG. 4 achieved in the third embodiment includes a second fixed-potential insulated electrode 36 constituted of a second MOS electrode 34 and a second insulating film 35 in addition to the structural features assumed in the semiconductor device shown in FIGS. 2 and 3 which is achieved in the second embodiment. The second fixed-potential insulated electrode 36, which is in contact with the cathode region 29, is continuous to the first fixed-potential insulated electrodes 26. In addition, the potential at the second fixed-potential insulated electrode 36 is sustained at a level equal to the potential at the emitter electrode 33 and the cathode electrode 39.

In other words, the semiconductor device in the third embodiment includes a second trench which is in contact with the main surface and the cathode region 29, and inside the second trench, the second fixed-potential insulated electrode 36, which is insulated from the collector region 22 and the base region 28 by the second insulating film 35 and has a potential sustained at a level equal to the potential at the emitter region 23 and the cathode region 29, is provided. The second fixed-potential insulated electrode 36 is continuous to the first fixed-potential insulated electrodes 26.

The operation of the semiconductor device achieved in the third embodiment shown in FIG. 4 is now explained. In this device, the base region 28 and the ring shaped cathode region 29 are formed over a greater distance from each other. Consequently, when the ground potential (0 V) is applied to the emitter electrode 33, a positive potential is applied to the collector electrode 31 and the ground potential or a negative potential is applied to the base region 28, a depletion layer similar to the depletion layer manifesting when the base region 28 and the ring shaped cathode region 29 are formed over a specific distance from each other expands at the collector region 22 around the second fixed-potential insulated electrode 36.

Namely, as in the semiconductor device in the second embodiment, an avalanche breakdown occurs at the end of the cathode region 29 on the side facing opposite the guard ring region 40 when the bipolar transistor in an ON state is turned off. This means that advantages similar to those achieved in the second embodiment are realized by forming the second fixed-potential insulated electrode 36, which is continuous to the first fixed-potential insulated electrodes and is in contact with the cathode region 29 even though the base region 28 and the cathode region 29 are formed over a greater distance from each other than the specific value.

Accordingly, the emitter region 23 formed between the base contact hole and the cathode contact hole set over the distance D can be utilized as an active region, in order to sustain the current gain at a specific level in the semiconductor device in the third embodiment. This allows a reduction in the size of the cathode region 29 and improves the extent of active region integration.

The present invention is not limited to the examples presented in the embodiments described above. For instance, while one conduction type (the conduction type at the collector region 2 or 22) is n-type in the embodiments explained above, this conduction type (the conduction type at the collector region) may be p-type. In addition, while the semiconductor device in the first embodiment constitutes a bipolar transistor in the explanation, similar advantages may be achieved in any type of current-driven semiconductor device (device) such as a bipolar static induction transistor.

The disclosure of the following priority application is herein incorporated by reference:
Japanese Patent Application No. 2001-25080 filed Feb. 1, 2001

What is claimed is:

1. A semiconductor device with base drive circuit protection having a semiconductor substrate of a first conduction type, with a collector region, an emitter region and a base region being formed on one main surface of the semiconductor substrate, including:
   a cathode region of a second conduction type different from the first conduction type that is formed at said main surface and is not in contact with either said emitter region or said base region, wherein said cathode region achieves a potential equal to the potential at said emitter region and is formed in a ring shape so as to enclose said emitter region and said base region and so as to being contact with said collector region.

2. A semiconductor device with base drive circuit protection according to claim 1, wherein:
   said collector region is constituted of said semiconductor substrate;
   said base region is a region of the second conduction type that is formed to be in contact with the main surface of said semiconductor substrate; and
   said emitter region is a region of the first conduction type that is formed in contact with the main surface of said base region.

3. A semiconductor device with base drive circuit protection according to claim 1, wherein:
   a base contact hole through which said base region and a base electrode achieve contact and a cathode contact hole through which said cathode region and a cathode electrode achieve contact are set apart over a distance that is larger than a diffusion length of minority carriers injected from said base region into said collector region.

4. A semiconductor device with base drive circuit protection according to claim 1, further comprising:
   first trenches, each having sidewalls and a bottom, provided so as to lie in contact with the main surface and to sandwich said emitter region,
   first fixed-potential insulated electrodes provided inside said first trenches, insulated by a first insulating film from said collector region and achieving a potential sustained at a level equal to the potential at said emitter region; and
   a channel region constituting a portion of said collector region in contact with said emitter region and sandwiched by said first fixed-potential insulated electrode, wherein:
   said collector region is constituted of said semiconductor substrate;
   said emitter region having a bottom is a region of the first conduction type that is formed in contact with the main surface of said semiconductor substrate with a higher impurity concentration than that of said collector region;

said base region is a region of the second conduction type that is formed in contact with the main surface of said semiconductor substrate;

said first fixed-potential insulated electrodes are constituted of a conductive material achieving a work function which allows a depletion layer to be formed at adjoining said collector region via said first insulating film;

the distance between the bottoms of said first trenches and said emitter region at the channel region being at least twice the distance between sidewalls of said first trenches facing opposite each other at said channel region; and said base region is in contact with said insulating film and said collector region, but not in contact with said emitter region.

5. A semiconductor device with base drive circuit protection according to claim 4, further comprising;

a second trench that is in contact with said main surface and said cathode region: and a second fixed-potential insulated electrode provided inside said second trench, insulated from said collector region and said base region by a second insulating film and achieving a potential sustained at a level equal to the potential at said emitter region and said cathode region, wherein:

said second fixed-potential insulated electrode is continuous to said first fixed-potential insulated electrode.

6. A semiconductor device with base drive circuit protection according to claim 4, wherein:

a base contact hole through which said base region and a base electrode achieve contact and a cathode contact hole through which said cathode region and a cathode electrode achieve contact are set apart over a distance that is larger than a diffusion length of minority carriers injected from said base region into said collector region.

7. A semiconductor device with base drive circuit protection according to claim 2, wherein:

a guard ring region is formed so as to enclose said cathode region.

8. A semiconductor device with base drive circuit protection according to claim 4, wherein:

a guard ring region is formed so as to enclose said cathode region.

* * * * *